(12) United States Patent
Lovett (10) Patent No.: US 10,522,235 B2
(45) Date of Patent: Dec. 31, 2019

(54) REPAIR FUSE LATCHES USING STATIC RANDOM ACCESS MEMORY ARRAY

(71) Applicant: Micron Technology, Inc., Boise, ID (US)

(72) Inventor: Simon J. Lovett, Middleton, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/109,092

(22) Filed: Aug. 22, 2018

(65) Prior Publication Data

US 2019/0066819 A1 Feb. 28, 2019

Related U.S. Application Data

(60) Provisional application No. 62/550,080, filed on Aug. 25, 2017.

(51) Int. Cl.
| | |
|---|---|
| *G11C 29/00* | (2006.01) |
| *G11C 7/00* | (2006.01) |
| *G11C 29/44* | (2006.01) |
| *G11C 11/412* | (2006.01) |

(52) U.S. Cl.
CPC ............... *G11C 29/00* (2013.01); *G11C 7/00* (2013.01); *G11C 11/412* (2013.01); *G11C 29/44* (2013.01); *G11C 2029/4402* (2013.01); *G11C 2229/763* (2013.01)

(58) Field of Classification Search
CPC ........... G11C 7/00; G11C 29/00; G11C 29/44; G11C 11/412; G11C 2029/4402; G11C 2229/763
See application file for complete search history.

(56) References Cited

U.S. PATENT DOCUMENTS

| | | | | |
|---|---|---|---|---|
| 5,859,801 | A * | 1/1999 | Poechmueller | G11C 19/00 365/189.12 |
| 6,603,690 | B1 * | 8/2003 | Chen | G11C 29/802 365/189.07 |
| 6,882,583 | B2 * | 4/2005 | Gorman | G11C 29/802 365/200 |
| 7,911,872 | B2 * | 3/2011 | Lakhani | G11C 29/789 365/200 |
| 2011/0231736 | A1 * | 9/2011 | Toops | G06F 11/1016 714/768 |

* cited by examiner

*Primary Examiner* — Ajay Ojha
(74) *Attorney, Agent, or Firm* — Schwegman Lundberg & Woessner, P.A.

(57) ABSTRACT

Various embodiments, disclosed herein, include apparatus and methods of using the apparatus having a core array of memory cells arranged as data storage elements; and an array of latches to store repair information for the core array. Each latch can be structured as a static random access memory cell. Additional apparatus, systems, and methods are disclosed.

11 Claims, 8 Drawing Sheets

REPAIR FUSE LATCHES USING STATIC RANDOM ACCESS MEMORY ARRAY

RELATED APPLICATION

This application claims priority under 35 U.S.C. 119(e) from U.S. Provisional Application Ser. No. 62/550,080, filed 25 Aug. 2017, which application is incorporated herein by reference in its entirety.

BACKGROUND

Three dimensional (3D) memory technology, using pillar access devices and other methods, is evolving in the memory industry. Use of 3D technology enables higher density for the memory array core of a memory device with memory cells arranged vertically. Such structures provide a number of levels of arrays of memory cells, where the levels arranged in a stack may be referred to as decks. However, periphery logic, such as redundancy repair fuses or other logic is built using conventional two dimensional (2D) planar transistors. Some recent designs use a fuse array to store repair information. With 3D vertically stacked memory cores using more repair elements, this configuration increases the number of fuse latches in each bank. For this reason, redundancy fuses will increasingly occupy a relatively larger percentage of 2D die area than for 2D planar array core designs. Going forward this trend will continue as 3D stacking is extended from a 2 deck structure to a 4 deck structure, an 8 deck structure, etc.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Conventional redundant column fuse sets are arranged as rows and columns in a matrix. An array of redundant fuse sets can be arranged as an array of column segment fuse sets. For example, the array of redundant fuse sets can be structured with respect to 64 segments, and further each fuse set usually can contain 6 or 7 bits. For a case of 8 redundant columns with each column having 64 column segments, each of which has 7 bits×16 half banks, there are 57,344 fuse latches for column repair. In this conventional approach, 7 transistors per fuse element are arranged in a matrix for the redundant column fuse sets.

In various embodiments, a compact fuse latch for local bank logic can be implemented based on a memory cell of a static random access memory (SRAM). SRAM cells can be arranged in a row and column matrix as an array of latches to store repair information for a core array of memory cells arranged as data storage elements. Repair information can be a series of bits that define the location that is being repaired. The number of bits can be typically somewhere between six and nine, though the number of bits may differ from six to nine bits. It is a collection, a group of bits, each one of which can store zero or one and it defines the repaired location. It is like an address map, where it points to where the repair is located in the address space. This location can be provided on a bank basis. This matrix can be referred to as a SRAM array. Each SRAM cell can be structured having six or less transistors per fuse element, which is less than half the size of a conventional fuse latch element.

Figure 1A:
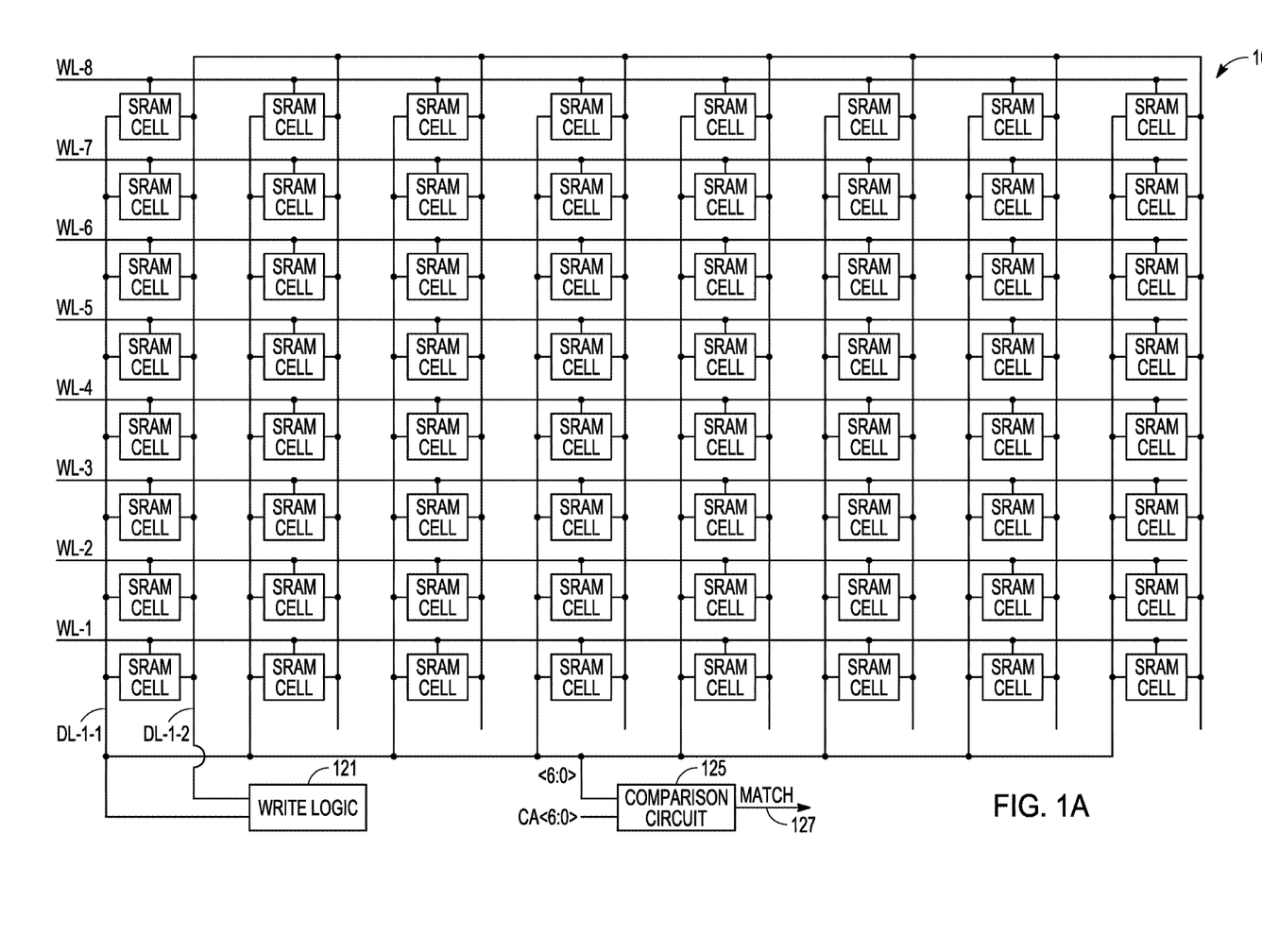
FIG. 1A is a schematic of a fuse array structured as a static random access memory array in a memory device, according to various embodiments.

FIG. 1A is a schematic of a fuse array structured as a SRAM array 100 in a memory device. The term fuse array is used to denote a data storage array arranged to store repair information for a core array of memory cells. The rows of the SRAM array can correspond to column segments of a core memory array in the memory device and are operatively coupled to access lines, similar to word lines. In the non-limiting example of FIG. 1A, SRAM array 100 includes access lines WL-1 . . . WL-8, where each of these access lines are coupled to eight SRAM cells with each of the eight SRAMs coupled to a pair of digitlines DL-1-1 and DL-1-2, which can be coupled to write logic 121. The digitlines DL-1-1 and DL-1-2 can provide complements of each other. An array of SRAM cells is not limited to the number and arrangement illustrated in FIG. 1A. For each of the columns shown in FIG. 1A, there can be additional SRAM cells coupled to access lines and to pairs of digital lines such that enablement of access to SRAM array 100 can include access to a set of SRAM cells to provide information regarding a location of a redundant data storage element. For example, digitline DL-1-1 can provide a number of information bits to comparison circuit 125 to be compared with respect to an external column address. The number of information bits <6:0> from SRAM array 100 can be compared to external column address, CA <6:0>. If there is a match, a redundant column match signal 127 is generated from comparison circuit 125. Comparison circuit 125 can include one or more comparators.

Accordingly, the access lines WL-1 . . . WL-8 can be selectively enabled by a row address asserted at the time of row address strobe (RAS), which is a row-enable signal of an row address in the core memory of the memory device. A column address strobe (CAS) is used as a column-enable signal of a column address in the core memory of the memory device. Both a RAS and a CAS are used to access a storage element in the memory core. Typically, a RAS is sent with a row address and then the CAS is sent with the appropriate column address. There is a delay between reception of the RAS and reception of the CAS, this delay is referred to as tRCD, which the time or number of cycles to wait before accessing one of the row's columns. In an example, a memory may have a tRCD of approximately 12 ns to 77 ns that elapses between RAS and CAS commands. Though a SRAM access line can be relatively slow, a SRAM array is still adequate for column repair for this tRCD example, since the tRCD is sufficiently long and redundant column information is not used until a CAS operation is asserted.

Figure 1B:
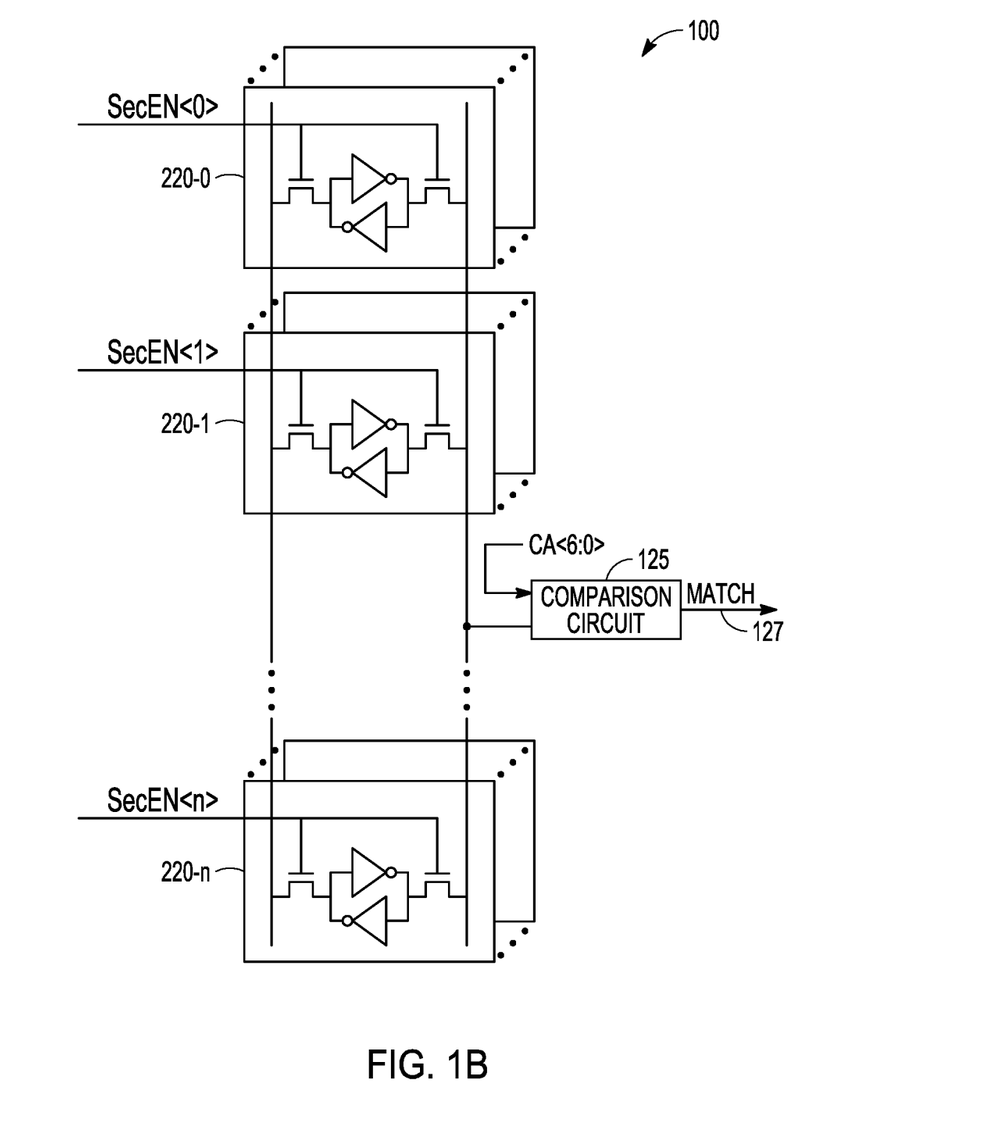
FIG. 1B is another schematic view of the static random access memory array of FIG. 1A, according to various embodiments.

FIG. 1B is another schematic view of SRAM array 100 of FIG. 1A. SRAM array 100 can be operated as having array sections 220-0, 220-1 . . . 220-*n*. Input into array sections 220-0, 220-1 . . . 220-*n* are array section enable signals SecEn<0>, SecEn<0> . . . SecEn<n>, respectively, on SRAM array access lines, such as WL1, . . . WL-8 of FIG. 1B. The SRAM array access lines may be structured and operated as wordlines. Each array section 220-*i* can include a group of seven bits, where each group of seven bits can define a column repair for the respective specific array section 220-*i*. Repair information from array sections 220-0, 220-1 . . . 220-*n* is driven onto the shared common digitlines DL-1-1 or DL-1-2 of FIG. 1A to comparison circuit 125 of FIG. 1A. Comparison circuit 125 compares the repaired column address with the read/write column address, such as CA<6:0>, input to comparison circuit 125. A repair match occurs when the stored address in SRAM array 100 matches the read/write address, CA<6:0>. If response to the occurrence of the match, comparison circuit 125 generates redundant column match signal 127.

Figure 2:
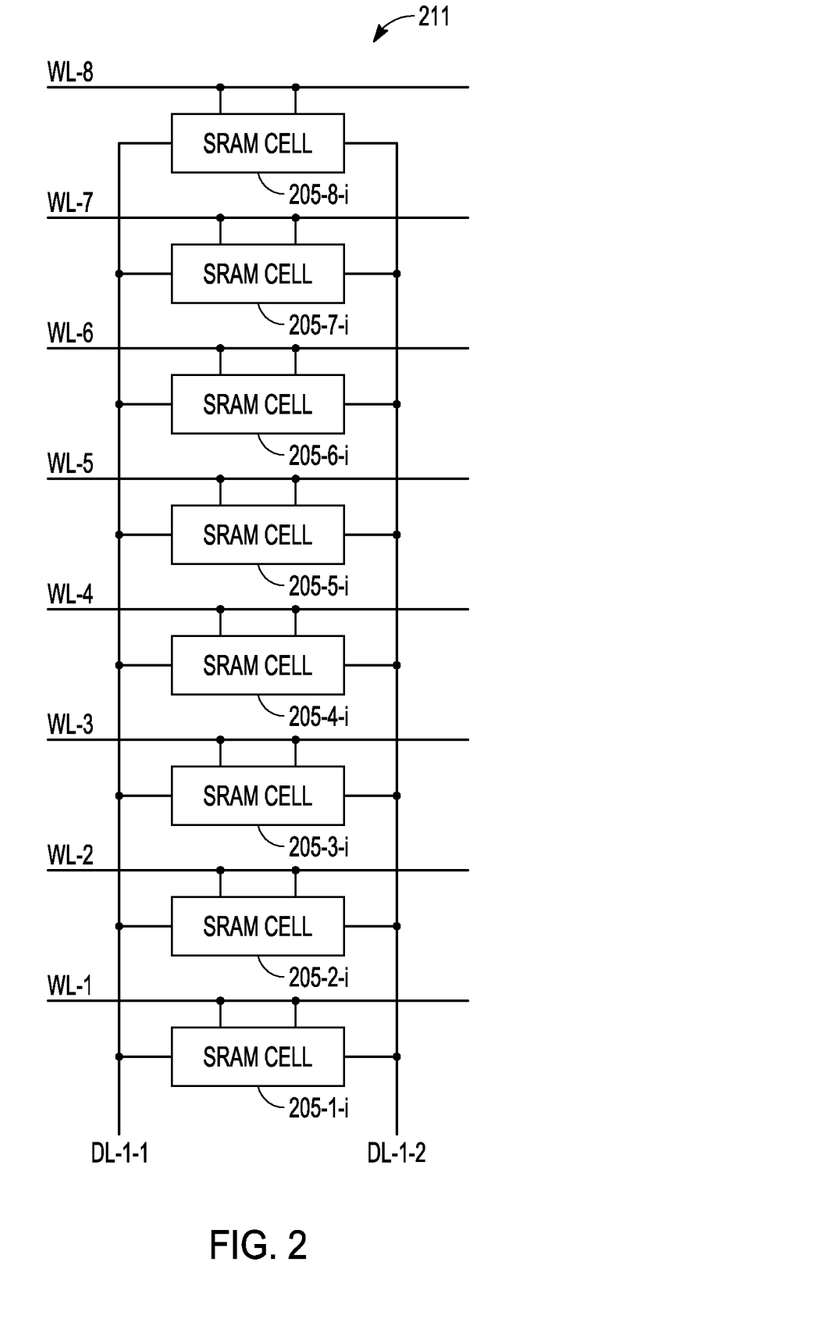
FIG. 2 is a schematic of a column that can be implemented in the static random access memory array of FIG. 1A, according to various embodiments.

FIG. 2 is a schematic of a column 211 which can be implemented in SRAM array 100 of FIG. 1A in which SRAM cells 205-1-*i* . . . 205-8-*i* that are coupled to different access lines WL 1 . . . WL8, respectively, share common digitlines DL-1-1 and DL-1-2. Each SRAM cells 205-1-*i* . . . 205-8-*i* can be operated as one fuse of a fuse set in which the one fuse can store one bit and the fuse set can have N fuse elements that together store N number of bits. The set of fuse cells, for example, can be equal to, but not limited to, seven bits. Though not shown the fuse set can include N−1 additional SRAM, where each of the additional SRAMs are coupled to a respective pair of digitlines with all SRAMs of the same fuse set accessed at the same time. SRAM array 100 can multiplex output from the fuse sets onto the pair of shared common digitlines. The multiplexing can be similar to conventional array of fuse sets. However, SRAM array 100 and similar arrays, as taught herein, are much more compact than conventional arrays, since a SRAM cell can be implemented with less transistors that a conventional latch cell.

Figure 3A:
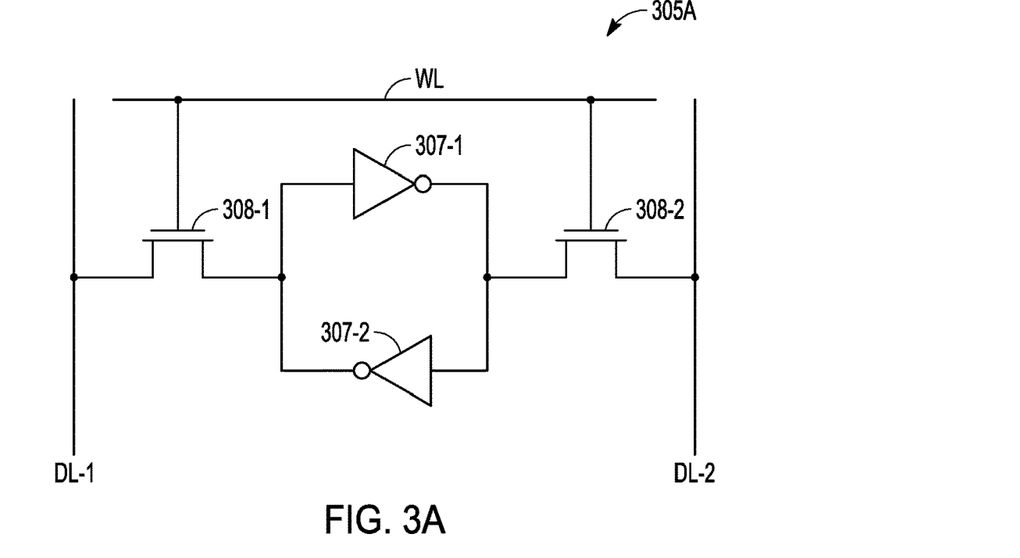
FIG. 3A is a schematic of a static random access memory cell that can be implemented in the static random access memory array of FIG. 1A as a compact fuse latch for local bank logic, according to various embodiments.

FIG. 3A is a schematic of a SRAM 305A that can be implemented in SRAM array 100 of FIG. 1A as a compact fuse latch for local bank logic. SRAM 305A can be structured as a standard cell having inverters 307-1 and 307-2 with access transistors 308-1 and 308-2. SRAM 305A can be coupled to digitlines DL-1 and DL-2 and coupled via gates of the access transistors 308-1 and 308-2 to an access line WL, in manner such as in FIG. 2. SRAM 305A can be realized with 6 transistors per fuse element rather than 14 transistors per fuse element used in conventional fuse arrays to store repair information.

Figure 3B:
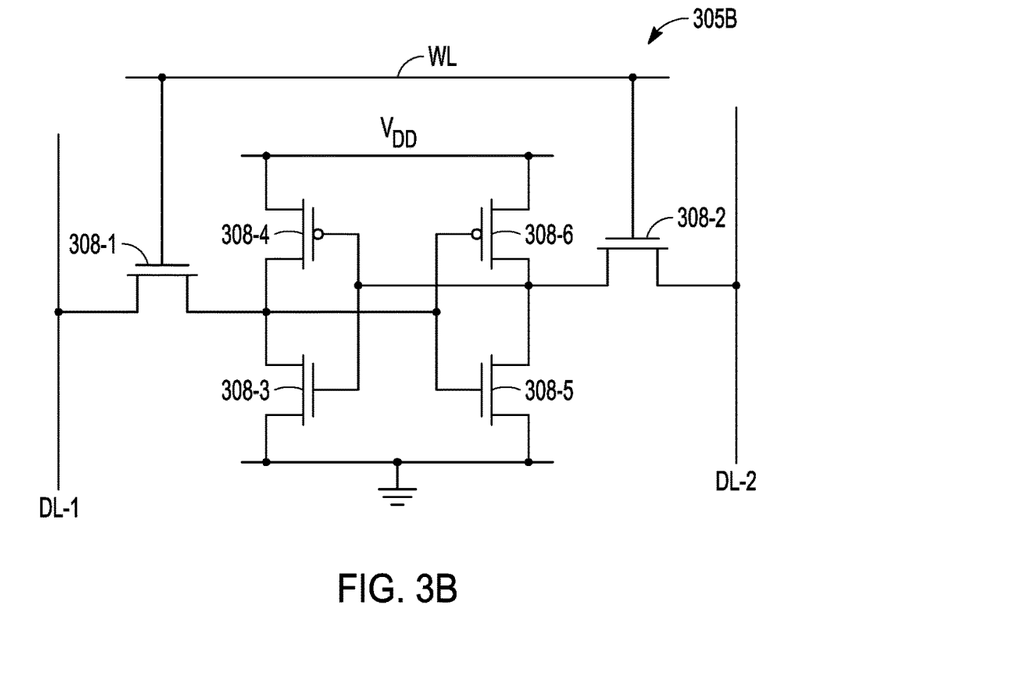
FIG. 3B is a schematic of a static random access memory cell that illustrates that the static random access memory cell of FIG. 3A can be implemented with six transistors, according to various embodiments.

FIG. 3B is a schematic of a SRAM 305B that illustrates that SRAM 305A can be implemented with six transistors 308-1 . . . 308-6. The combination of inverters 307-1 and 307-2 of FIG. 3A can be implemented by transistors 308-3, 308-4, 308-5 and 308-6 of FIG. 3B. SRAM 305B can be coupled to DL-1 and DL-2, which can be operated as complements of each other. Such a layout is approximately half the size of a conventional circuit. This enhancement can become increasingly significant as 3D memory technology is extended beyond 2 decks to 4 decks, 8 decks, and beyond.

Figure 4:
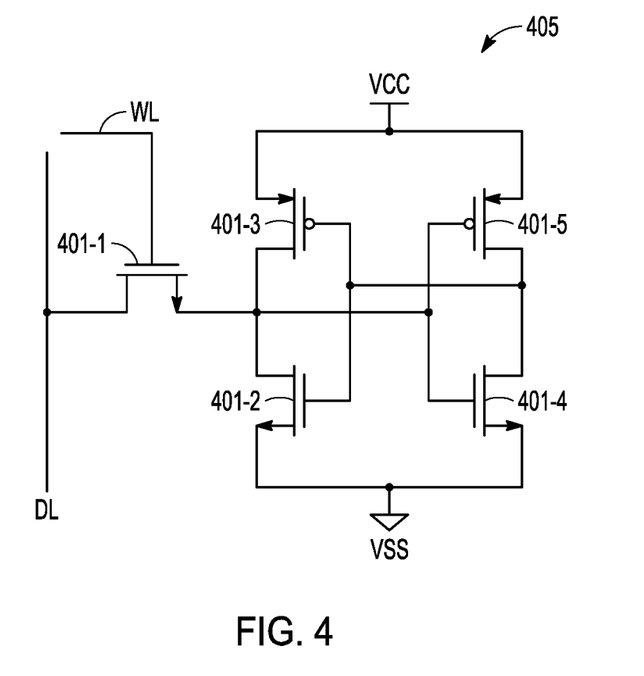
FIG. 4 is a schematic of a static random access memory cell that can be implemented in a static random access memory array as a compact fuse latch for local bank logic, according to various embodiments.

FIG. 4 is a schematic of a SRAM 405 that can be implemented in a SRAM array as a compact fuse latch for local bank logic. SRAM 405 can be realized as a five transistor cell coupled to an access line WL to access SRAM 405 and coupled to a digitline DL to store and provide repair information. SRAM 405 can include transistors 401-1, 401-2, 401-3, 404-4, and 404-5. Transistors 401-2, 401-3, 404-4, and 404-5 can be used to store information. A gate of transistor 401-1 can be coupled to access line WL for access to SRAM 405. Digitline can be coupled to drain/source of transistor 401-1 to pass information to and from SRAM 405. Write and read operations can performed using just one digitline rather than a pair of digitlines as used with a six transistor SRAM cell such as in FIGS. 2 and 3A-3B.

Figure 5:
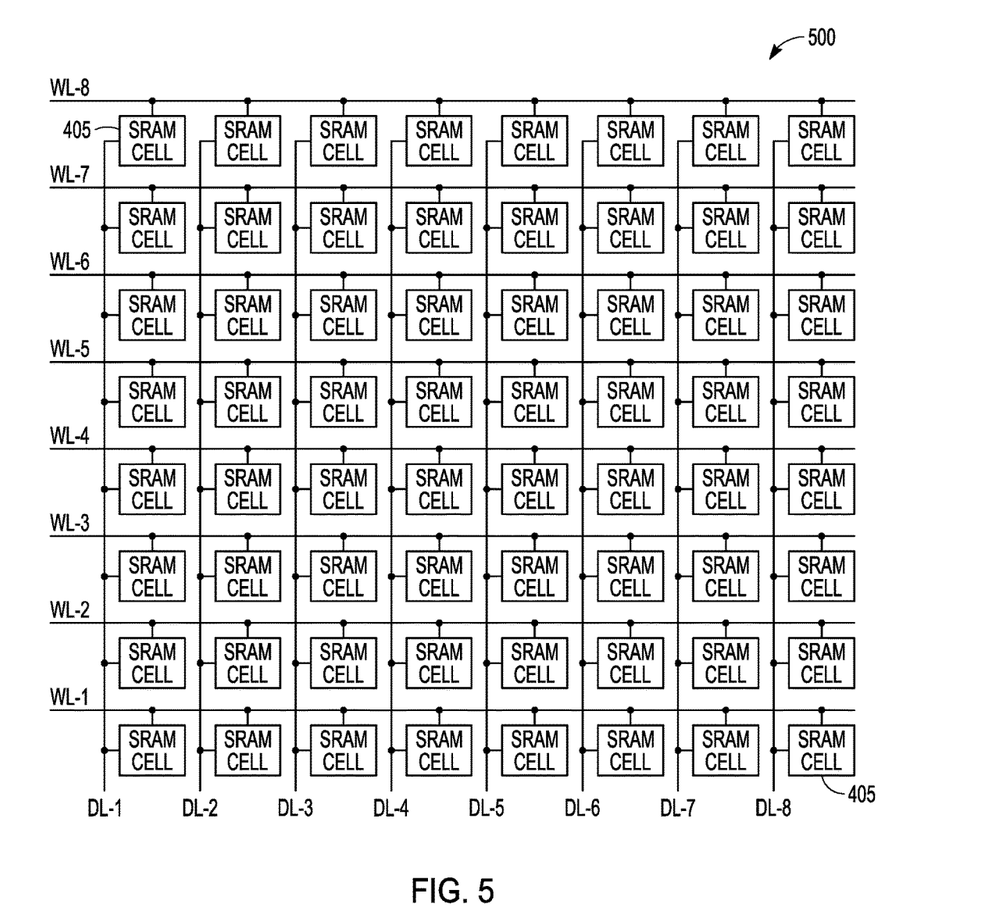
FIG. 5 is a schematic of a matrix using the static random access memory cells of FIG. 4, according to various embodiments.

FIG. 5 is a schematic of a matrix 500 using SRAM cells 405 of FIG. 4 arranged with respect to access lines WL-1, WL-2, WL-3, WL-4, WL-5, WL-6, WL-7, and WL-8 and digitlines DL-1, DL-2, DL-3, DL-4, DL-5, DL-6, DL-7, and DL-8. Though not shown, each SRAM cell 405 can be arranged with N-1 other such five transistor SRAM cells to form a set of fuse cells to be accessed as a unit, with each SRAM coupled to its respective digitline. The number, N, of five transistor SRAM cells in a set can be, but is not limited to, seven. As noted above, write and read operations for a SRAM cell can be performed using one DL for a SRAM cell accessed by one access line.

These SRAM latches can be used as column commands or issues for reads and writes. Each column command is associated with an address such that when an address is provided to the memory device, that address is compared against the information that is contained in these SRAM fuse latches. When a match is found, that match indicates a redundant match and that triggers a redundant match event where data is steered to a different path. A data path that connects the data input terminal (DQs) on the memory device chip to each of the internal banks of the memory device. The data path is a conduit that brings the data from the DQs to the banks in the case of a write and from the banks back to the DQs in the case of a read. In the case of a redundant memory match, which is the column match mentioned above, a controller, based on the match, can steer the data to a separate redundant array instead of storing the data in the core array, which is the main memory of the memory device. The redundant array is a small array that effectively sits alongside the core array, and it is the array used as the repair array.

The rows of a SRAM array, arranged as an array of repair information for a bank, can correspond to a column segment of a bank of the core memory of the memory devices. Typically, the memory core array is organized into banks, where each bank has a number of segments. For example, a bank or a half bank of a memory device may have 32 segments. Each of the 32 segments is a separate column segment corresponding to a different row region, such that each of the segments contains independent word lines. With the columns in a Y direction, each of the 32 sections has unique row address in the X direction. Each of the 32 segments of a column is associated with independent repairs. In other words, each physical redundant column can repair a different column address in each segment, that is, one physical redundant column can fix up to 32 failing bits—one in each column segment. A column address can include one or more bits to indicate a deck of the core memory array. It is possible to reactivate the same repair element numerous times to repair different column segments. Effectively, a physical column can be reused to expand its repair capability.

Figure 6:
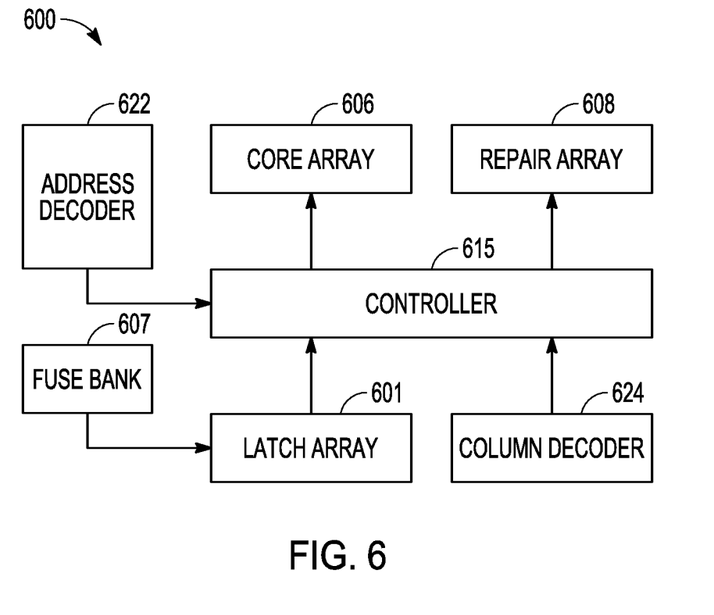
FIG. 6 is a block diagram of a core array and a repair array of a memory device, according to various embodiments.

FIG. 6 is a block diagram of a memory device 600 having a core array 606 and a repair array 608 with a latch array 601 to store repair information. Memory device 600 can include fuse array 607 that is a mini-array that stores repair information. Fuse bank 607 may be structured as fuse elements that reside somewhere on the die of memory device 600. At power-up, the fuse information from fuse array 607 is broadcast to individual banks of memory device 600, where it is stored in a plurality of fuse latches of latch array 601. Latch array 601 can be realized as a SRAM array as taught herein. Controller 615 can be structured to control operations to compare addresses for access to the core memory and information stored in latch array 601, and redirect data flow to the repair array 608 instead of core array 606 based on a match determined in the comparison. Controller 615 can be arranged as a distributed unit in memory device 600 providing independent task coordination or unified coordination. The components of memory device 600 are not limited to particular layout and can be arranged in various layouts to perform the functions of memory repair using a latch array of SRAM cells, as taught herein.

Figure 7:
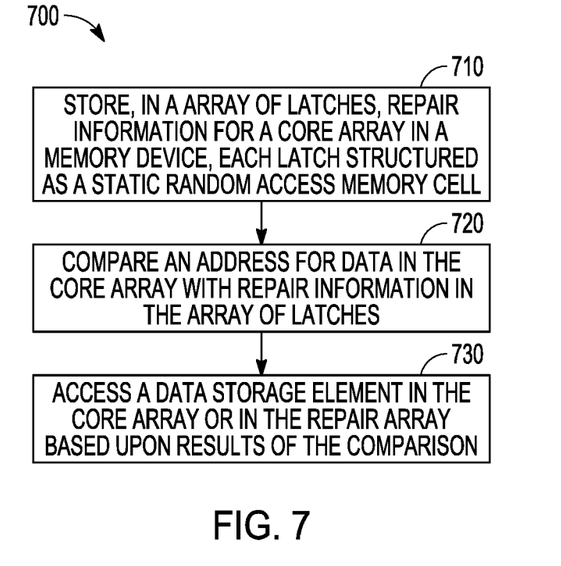
FIG. 7 is a flow diagram of elements of an example method of operating a static random access memory array with respect to memory repair, according to various embodiments.

FIG. 7 is a flow diagram of elements of an embodiment of an example method of operating a SRAM array with respect to memory repair. At 710, repair information for a core array in a memory device is stored in an array of latches, where each latch is structured as a static random access memory cell. The memory array has a core array of memory cells arranged as data storage elements and a repair array of memory cells arranged as repair data storage elements. Storing repair information in the array of latches can include storing the repair information in an array of latches in which each latch is a static random access memory cell having six transistors and is coupled to a pair of digitlines to provide information for the comparison. Storing repair information in the array of latches can include storing the repair information in an array of latches in which each latch is a static random access memory cell having five transistors and is coupled to a single digitline to provide information the comparison.

At 720, an address for data in the core array is compared with repair information in the array of latches. At 730, a data storage element in the core array or in the repair array is accessed based upon result of the comparison. If the comparison result is not a match between addresses being compared, the core array can be accessed. If the comparison results in a match between addresses compared, the repair array can be accessed.

Variations of method 700 or methods similar to method 700 can include a number of different embodiments that may depend on the application of such methods and/or the architecture of systems in which such methods are implemented. Such methods can include providing the repair information to the array of latches from a fuse array, which can be a fuse bank, of the memory device upon power-up of the memory device. Variations of method 700 or methods similar to method 700 can include operating according to features of a SRAM array arranged as an array to store repair information, as taught herein.

In various embodiments, a memory device can comprise: a core array of memory cells arranged as data storage elements, and an array of latches to store repair information for the core array, where each latch is structured as a static random access memory cell. The array of latches can be arranged as rows and columns with the rows of the array of latches corresponding with column segments of the core array. The access lines to the array of latches can operatively be enabled by row addresses asserted at time of a row address strobe (RAS) command. The core array can be a two dimensional or three-dimensional array of one or more decks and the array of latches can be a two-dimensional array.

Each static random access memory cell can have six transistors. The array of latches can include a number of sets of multiple static random access memory cells, where the multiple static random access memory cells of each set are operatively multiplexed onto a pair of shared digitlines for the respective set. Each static random access memory cell of the respective set can be coupled to a different access line than the other static random access memory cells of the respective set such that operationally one static random access memory cell of each set is active at a given time. The memory device can be structured to activate one static random access memory cell of each set to provide the repair information on the pairs of digitlines. A plurality of sets of multiple static random access memory cells can be employed for one half bank of the core array. The number of sets of multiple static random access memory cells may be seven for one half bank of the core array.

Alternatively, each static random access memory cell can have five transistors structured such that each static random access memory cell is coupled to only one access line and only one digitline. The one digitline can be coupled to a number of other static random access memory cells having five transistors forming a set of static random access memory cells structured such that each static random access memory cell is coupled to only one access line and only the one digitline, and the memory device can be structured to activate a selected one of the static random access memory cells coupled to the one digitline at a given time.

In various embodiments, a memory device can comprise: a core array of memory cells arranged as data storage elements; an array of latches to store repair information for the core array, where each latch is structured as a static random access memory cell; a repair array of memory cells arranged as repair data storage elements; and a controller arranged to compare an address for data in the core array with repair information in the array of latches and to steer access to the repair array instead of access to the core array upon determination of a match from the comparison. The memory device can include a fuse array, which can be a fuse bank, to store the repair information and to provide the repair information to the array of latches upon power-up of the memory device, or responsive to an external or internal command or triggered by other means. The repair information can include a plurality of bits that define a repair address of the repair array. The array of latches can include a number of sets of multiple static random access memory cells, where the multiple static random access memory cells of each set are operatively multiplexed onto a pair of shared digitlines for the respective set. Each static random access memory cell of the respective set can be coupled to a different access line than the other static random access memory cells of the respective set such that operationally one static random access memory cell of each set is active at a given time. The pairs of shared digitlines can be coupled to the controller to provide the repair information from the array of latches. Each set can have seven static random access memory cells.

Figure 8:
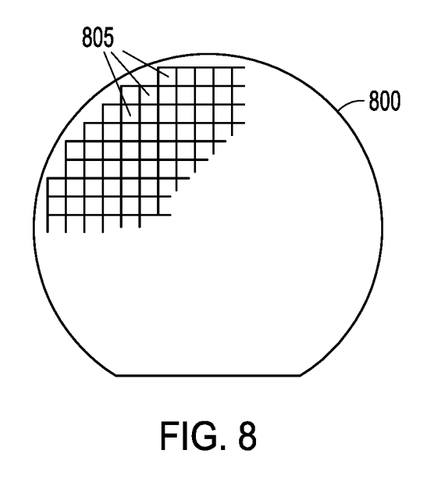
FIG. 8 illustrates an example of a wafer arranged to provide multiple electronic components including a memory device having an architecture with random access memory cells as an array of latches to store repair information for a core array of memory cells arranged as data storage elements, according to various embodiments.

FIG. 8 illustrates an example of a wafer 800 arranged to provide multiple electronic components. Wafer 800 can be provided as a wafer in which a plurality of dice 805 can be fabricated. Alternatively, wafer 800 can be provided as a wafer in which the plurality of dice 805 have been processed to provide electronic functionality and are awaiting singulation from wafer 800 for packaging. Wafer 800 can be provided as a semiconductor wafer, a semiconductor on insulator wafer, or other appropriate wafer for processing electronic devices such as an integrated circuit chips. Wafer 800 can be fabricated in accordance with any embodiment related to FIGS. 1-7.

Using various masking and processing techniques, each die 805 can be processed to include functional circuitry such that each die 805 is fabricated as an integrated circuit with the same functionality and packaged structure as the other dice on wafer 800. Alternatively, using various masking and processing techniques, various sets of dice 805 can be processed to include functional circuitry such that not all of the dice 805 are fabricated as an integrated circuit with the same functionality and packaged structure as the other dice on wafer 800. A packaged die having circuits integrated thereon providing electronic capabilities is herein referred to as an integrated circuit (IC).

Wafer 800 can include memories, where each memory is located in a die 805. The memory may be structured as a 3D memory device having a plurality of memory cells disposed in a plurality of strings using conventional fabrication technologies and procedures. Each memory device can include an array of SRAM cells to store repair information for the core array for data storage of the memory device, associated with any of FIGS. 1-7 as taught herein.

Figure 9:
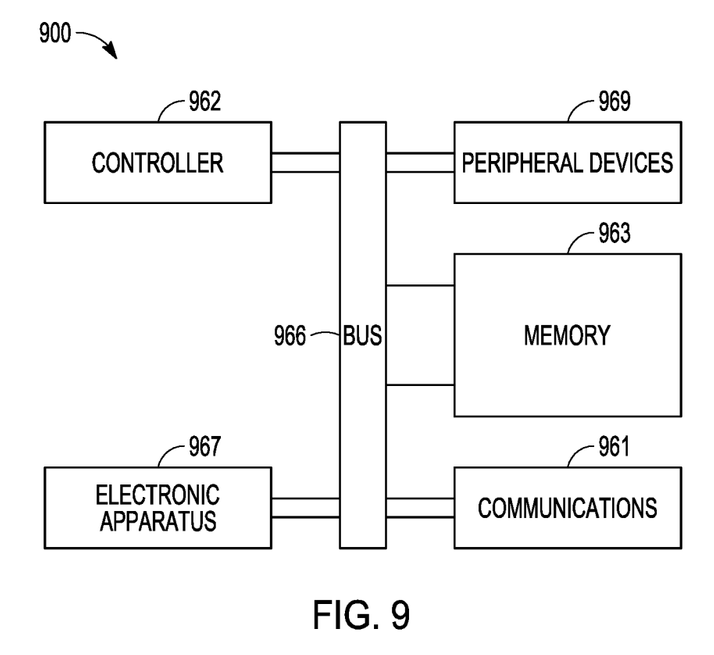
FIG. 9 shows a block diagram of a system that includes a memory structured with random access memory cells as an array of latches to store repair information for a core array of memory cells arranged as data storage elements, according to various embodiments

FIG. 9 shows a block diagram of a system 900 that includes a memory 963 structured with a core array, a repair array, and an array of SRAM cells to store repair information for the core array for data storage of the memory device. Memory 963 can be a realized as a 3D NAND memory or any other type of memory. The device architectures of memory 963 having a SRAM array to store repair information for the core array can be realized in a manner similar to or identical to structures in accordance with various embodiments discussed herein.

System 900 can include a controller 962 operatively coupled to memory 963. Controller 902 can be in the form or one or more processors. System 900 can also include an electronic apparatus 967, peripheral devices 969, and a communications module 961. One or more of controller 962, memory 963, electronic apparatus 967, peripheral devices 969, and communications module 961 can be in the form of one or more ICs.

A bus 966 provides electrical conductivity between and/or among various components of system 900. In an embodiment, bus 966 includes an address bus, a data bus, and a control bus, each independently configured. In an alternative embodiment, bus 966 uses common conductive lines for providing one or more of address, data, or control, the use of which is regulated by controller 902. Bus 966 can include components of a communications network.

Electronic apparatus 967 may include additional memory. Memory in system 900 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, magnetic based memory, or other emerging memory cell technology.

Peripheral devices 969 may include displays, imaging devices, printing devices, wireless devices, additional storage memory, and control devices that may operate in conjunction with controller 962. In various embodiments, system 900 can include, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A memory device comprising:
   a core array of memory cells arranged as data storage elements; and
   an array of latches to store repair information for the core array, each latch structured as a static random access memory cell, wherein each static random access memory cell has six transistors, wherein the array of latches includes a number of sets of multiple static random access memory cells, the multiple static random access memory cells of each set multiplexed onto a pair of shared digitlines for the respective set, each static random access memory cell of the respective set coupled to a different access line than the other static random access memory cells of the respective set such that operationally one static random access memory cell of each set is active at a given time.

2. The memory device of claim 1, wherein the memory device is structured to activate one static random access memory cell of each set to provide the repair information on the pairs of digitlines.

3. The memory device of claim 2, wherein a plurality of sets of multiple static random access memory cells is employed for one half bank of the core array.

4. A memory device comprising:
a core array of memory cells arranged as data storage elements; and
an array of latches to store repair information for the core array, each latch structured as a static random access memory cell, wherein each static random access memory cell has five transistors structured such that each static random access memory cell is coupled to only one access line and only one digitline.

5. The memory device of claim 4, wherein the one digitline is coupled to a number of other static random access memory cells having five transistors forming a set of static random access memory cells structured such that each static random access memory cell is coupled to only one access line and only the one digitline, and the memory device is structured to activate a selected one of the static random access memory cells coupled to the one digitline at a given time.

6. A memory device comprising:
a core array of memory cells arranged as data storage elements; and
an array of latches to store repair information for the core array, each latch structured as a static random access memory cell, wherein the array of latches is arranged as rows and columns with the rows of the array of latches corresponding with column segments of the core array.

7. The memory device of claim 6, wherein access lines to the array of latches are operatively enabled by row addresses asserted at time of a row address strobe (RAS) command.

8. A memory device comprising:
a core array of memory cells arranged as data storage elements;
an array of latches to store repair information for the core array, each latch structured as a static random access memory cell;
a repair array of memory cells arranged as repair data storage elements; and
a controller arranged to compare an address for data in the core array with repair information in the array of latches and to steer access to the repair array instead of access to the core array upon determination of a match from the comparison, wherein the array of latches includes a number of sets of multiple static random access memory cells, the multiple static random access memory cells of each set multiplexed onto a pair of shared digitlines for the respective set, each static random access memory cell of the respective set coupled to a different access line than the other static random access memory cells of the respective set such that operationally one static random access memory cell of each set is active at a given time.

9. The memory device of claim 8, wherein the pairs of shared digitlines are coupled to the controller to provide the repair information from the array of latches.

10. The memory device of claim 8, wherein each set has eight static random access memory cells.

11. A method comprising:
storing repair information in an array of latches for a core array in a memory device, each latch structured as a static random access memory cell, the memory array having a core array of memory cells arranged as data storage elements and a repair array of memory cells arranged as repair data storage elements;
comparing an address for data in the core array with repair information in the array of latches; and
accessing a data storage element in the core array or in the repair array based upon results of the comparison, wherein storing repair information in the array of latches includes storing the repair information in an array of latches in which each latch is a static random access memory cell having five transistors and is coupled to a single digitline to provide information for the comparison.

* * * * *